May 5, 1964 I. W. A. NELSON 3,132,306
AUTOMATIC GAIN CONTROL CIRCUIT
Filed Oct. 6, 1960
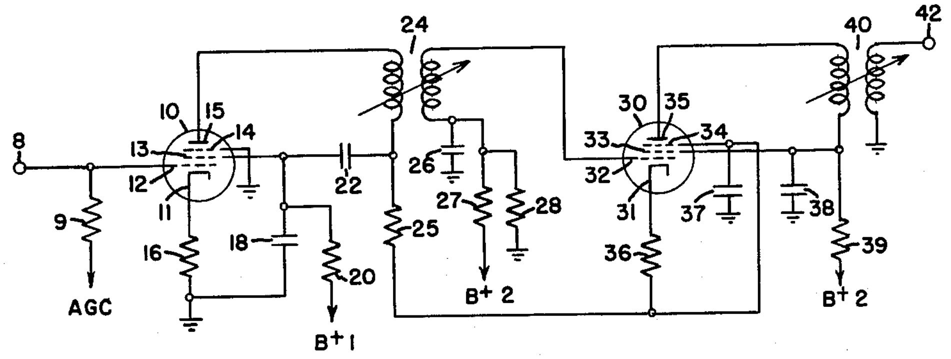
INVENTOR:
IVAN W. A. NELSON,
BY Joseph Levinson
HIS ATTORNEY.

3,132,306
Patented May 5, 1964

3,132,306

AUTOMATIC GAIN CONTROL CIRCUIT

Ivan Winston A. Nelson, Decatur, Ill., assignor to General Electric Company, a corporation of New York Filed Oct. 6, 1960, Ser. No. 60,842
1 Claim. (Cl. 330—70)

This invention relates to an automatic gain control circuit, and more particularly to an automatic gain control circuit for controlling the gain of two amplifier stages which are serially connected for direct current.

Many television receivers have the first and second intermediate frequency (IF) amplifiers connected in series for direct current which is commonly known as a "stacked" configuration. By applying an automatic gain control (AGC) voltage to the grid of the first IF amplifier, the gain of the two stages is controlled because the two IF stages are in series.

The IF stages may be controlled in this manner with a simple form of AGC voltage comprised of the D.C. component of the detector output and the D.C. component developed at the sync clipper grid which are matrixed to apply the desired level of AGC to the grid of the first IF stage provided that the amplifier tubes used are the sharp cut-off type. The only problem in using sharp cut-off type tubes resides in the distortion in the synchronization portion of the signal when the tubes are operated near cut-off. To overcome this difficulty remote cut-off IF tubes are employed, but when they are operating in a stacked configuration it has been found necessary to use an amplified AGC, such as keyed AGC, to control their gain adequately. This requires an additional stage.

Accordingly, it is an object of this invention to provide an improved automatic gain control circuit which utilizes a simple form of readily available AGC voltage without requiring an additional stage of amplification.

A further object of this invention is to provide an improved AGC circuit which can operate over a greater range of radio frequency signal levels without the need of additional amplified or kyed AGC circuits.

Still a further object of this invention is to provide an improved AGC circuit which is less expensive than types now available which provide similar operational results.

In carrying out this invention, the first and second IF amplifiers are connected in a "stacked" configuration with the screen grid of the first IF amplifier being supplied from a fixed potential such that the anode and screen grid currents of the second IF amplifier are controlled essentially from only the anode current of the first IF amplifier.

These and other objects of this invention and its operation will be more clearly understood from the following description taken in connection with the accompanying drawing and its scope will be apparent from the appended claim.

The drawing is a schematic diagram of the improved automatic gain control circuit embodied in this invention.

Referring now to the drawing, the automatic gain control circuit includes a first IF amplifier 10 having a cathode 11, a control grid 12, a screen grid 13, a suppressor grid 14 and an anode 15 and a second IF amplifier 30 having a cathode 31, a control grid 32, a screen grid 33, a suppressor grid 34 and an anode 35. An input terminal 8 which supplied an intermediate frequency signal from a tuner converter stage is connected to the control grid 12 of amplifier 10. An automatic gain control voltage is also applied to the control grid 12 by a resistor 9. The automatic gain control voltage may be derived from matrixing the D.C. component at the output of the video detector with the D.C. component developed at the clipper grid in the clipper stage of a television receiver. By utilizing this simple form of automatic gain control voltage no further amplification such as keyed AGC is required. The cathode 11 is connected by a small resistor 16 to ground which places the cathode at a potential slightly above that of ground. The intermediate frequency signal which is applied at input terminal 8 is coupled from the anode 15 of amplifier 10 via a transformer 24 to the grid 32 of the amplifier 30.

The amplifiers 10 and 30 are also direct current coupled which is commonly referred to as "stacked." A resistor 25 is coupled to a cathode resistor 36 which is connected to the cathode 31. A source referred to as $B+1$ potential, which is an intermediate value of a source of B+ potential, herein referred to as $B+2$, is applied to the screen grid 13 by a resistor 20. The resistor 20 is bypassed to ground by a bypass capacitor 18. A capacitor 22 blocks the application of D.C. current to the cathode 31 of amplifier 30. The suppressor grid 14 is connected to ground. A positive potential is supplied to the grid 32 of the amplifier 30 from a source of potential $B+2$ via a voltage divider consisting of resistor 27 and a resistor 28. The voltage divider is bypassed to ground by bypass capacitor 26. The intermediate frequency output appearing at the anode 35 of amplifier 30 is delivered by a transformer 40 to an output terminal 42. A source of potential $B+2$ is applied via resistor 39 to the screen grid 33 and the anode 35 of amplifier 30. The suppressor grid 34 is connected to the junction of the resistors 36 and 25.

In operation, the amplifiers 10 and 30 are connected in series or stacked with the total B+ potential $B+2$ being placed thereacross with the cathode 11 of amplifier 10 being near ground potential and the anode 35 of amplifier 30 being near the maximum or $B+2$ potential. The screen grid 13 and the anode 15 of amplifier 10 and the cathode 31 and control grid 32 of amplifier 30 are at intermediate or $B+1$ voltage which is approximately half of the $B+2$ voltage. Taking as an example a case where the AGC voltage applied to grid 12 is increasing which effectively makes the grid 12 more negative, the anode current of anode 15 is reduced and the anode voltage thereon is increased thereby increasing the cathode voltage on cathode 31. Increasing the cathode voltage in a positive direction has the effect of placing a greater bias on the grid 32 which is then less positive than the rising cathode potential thereby cutting the anode current of amplifier 30. The reverse is true on decreasing the automatic gain control voltage applied to the grid 12. In the foregoing explanation, it should be noted that in the usual configuration where the screen grid 13 is connected directly to the junction of resistor 25 and the primary winding of transformer 24, and thereby eliminating resistor 20 and capacitor 22, that by placing a greater automatic gain control voltage on the grid 12 which increases the anode potential of amplifier 10, also increases the screen grid potential. Such would increase the plate current and would tend to defeat the proper working of the automatic gain control circuit. Accordingly, the present invention applies a fixed $B+1$ potential to the screen grid thereby holding the screen grid voltage to a particular level and allowing the plate current of amplifier 10 to control the plate and screen grid currents of the amplifier 30. By so doing, remote cut-off type amplifier tubes may be used for both amplifiers 10 and 30 without affecting appreciably the operation of the automatic gain control circuit and without the necessity of providing an amplified or keyed type AGC circuit in conjunction with the amplifiers 10 and 30.

By way of example only, a set of circuit parameters which have been found to be suitable for operation in the circuit disclosed by applicant's invention are as follows:

| | | |
|---|---|---|
| Amplifiers **10** and **30** | | 6BZ6 |
| Resistor **9** | ohms | 5600 |
| Resistor **16** | do | 47 |
| Resistor **20** | do | 470 |
| Capacitor **18** | mmf | 470 |
| Capacitor **22** | mmf | 800 |
| Resistor **25** | ohms | 220 |
| Resistors **27** and **28** | do | 150K |
| Capacitor **26** | mmf | 800 |
| Resistor **36** | ohms | 22 |
| Capacitor **37** | mmf | 800 |
| Capacitor **38** | mmf | 300 |
| Resistor **39** | ohms | 220 |
| Source $B+1$ | volts | 135 |
| Source $B+2$ | do | 275 |

It will be noted from the above listing of parts and circuit parameters that a pair of remote cut-off tubes are used which allows the circuit embodied in this invention to adequately operate over a much greater range of RF signal levels than was heretofore possible when using sharp cut-off tubes in the IF stages. Further the circuit allows for proper AGC operation without requiring special keyed AGC circuits to supply the initial AGC voltages. The circuit also has greater flexibility in that the amplifiers 10 and 30 can be interchanged without greatly affecting the required AGC voltage.

Although other changes and modifications varied to fit particular operating requirements and environments will be apparent to those skilled in the art, this invention is not considered limited to the examples chosen for purposes of disclosure and covers all changes and modifications which do not constitute departures from the true spirit and scope of this invention.

What I claim as new and desire to secure by Letters Patent of the United States is:

An amplifier comprising a first amplifier stage having a first electron discharge device including a cathode, a control grid, a screen grid and an anode, a second amplifying stage having a second electron discharge device including a cathode, a control grid, a screen grid and an anode, means coupling said first and second stages in a stacked amplifier configuration for direct currents, the anode of said first electron discharge device being connected to the cathode of said second electron discharge device, means coupling said first and second amplifier stages in cascade for alternating current signals, means for applying a direct current potential of a predetermined value between the cathode of one of said first electron discharge device and the anode of said second electron discharge device, a source of automatic gain control voltage, means for applying the automatic gain control voltage between said control grid and cathode of said first electron discharge device, means for establishing said screen grid electrode of said first electron discharge device at a direct current operating potential which is substantially independent of the amplitude of the screen grid current, and means for applying a fixed direct current operating potential to said control grid of said second electron discharge device, said latter operating potential having a value that is intermediate the value of potential applied to said cathode of said first electron discharge device and said anode of said second electron discharge device.

References Cited in the file of this patent

UNITED STATES PATENTS

| | | |
|---|---|---|
| 2,874,234 | Parker | Feb. 17, 1959 |
| 2,881,265 | Swierczak | Apr. 7, 1959 |

FOREIGN PATENTS

| | | |
|---|---|---|
| 559,078 | Great Britain | Feb. 3, 1944 |
| 1,021,030 | Germany | Dec. 19, 1957 |